(12) United States Patent
Kautz

(10) Patent No.: US 9,523,728 B2
(45) Date of Patent: Dec. 20, 2016

(54) ELECTROMAGNETIC STRIPLINE TRANSMISSION LINE STRUCTURE

(71) Applicant: FORD GLOBAL TECHNOLOGIES, LLC, Dearborn, MI (US)

(72) Inventor: Richard William Kautz, North Branch, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 641 days.

(21) Appl. No.: 13/739,043

(22) Filed: Jan. 11, 2013

(65) Prior Publication Data
US 2014/0197907 A1 Jul. 17, 2014

(51) Int. Cl.
*G01R 29/10* (2006.01)
*G01R 31/00* (2006.01)
*G01R 29/08* (2006.01)

(52) U.S. Cl.
CPC ......... *G01R 31/001* (2013.01); *G01R 29/0821* (2013.01)

(58) Field of Classification Search
CPC .... G01R 29/10; G01R 31/001; G01R 29/0821
USPC .......... 343/703, 905; 333/136, 237; 324/537
See application file for complete search history.

(56) References Cited

U.S. PATENT DOCUMENTS

| | | | |
|---|---|---|---|
| 4,891,614 A | 1/1990 | De Ronde | |
| 5,075,655 A | 12/1991 | Pond et al. | |
| 5,134,405 A | 7/1992 | Ishihara et al. | |
| 5,436,603 A * | 7/1995 | Fischer | 333/243 |
| 5,471,223 A | 11/1995 | McCorkle | |

FOREIGN PATENT DOCUMENTS

| | | |
|---|---|---|
| JP | 2000111598 A | 4/2000 |
| JP | 2001086136 A | 3/2001 |

OTHER PUBLICATIONS

Dam, Atripline Antenna for Radiated Immunity Testing, Oct. 27, 2011, University of Twente, pp. 45-94.*
English Translation for JP2000111598 (13 pages).
English Translation for JP2001086136 (8 pages).

* cited by examiner

*Primary Examiner* — Dieu H Duong
(74) *Attorney, Agent, or Firm* — Damian Porcari; Brooks Kushman P.C.

(57) ABSTRACT

A transmission line structure includes a first transition element, a second transition element, and an active element. The first transition element has a radio frequency injection port and the second transition element, which is spaced from the first transition element, has a radio frequency termination port. An active element is in electrical communication with the first transition element and the second transition element. The active element includes a first and second connection region where the active element is attached to the first and second transition elements. The connection regions are configured to reduce reflection of electromagnetic energy.

6 Claims, 4 Drawing Sheets

ELECTROMAGNETIC STRIPLINE TRANSMISSION LINE STRUCTURE

BACKGROUND

Electromagnetic compatibility testing looks for unintentional propagation of electromagnetic waves, resulting in electromagnetic emission or susceptibility. Different environments exist for testing electromagnetic compatibility. One kind of environment includes an antenna that radiates a spherical wavefront. A second kind includes an electromagnetic reverberation chamber. A third kind of environment is a transmission line structure. The kind of environment selected may be based on various factors, such as the wavelength, whether the test includes high or low frequency transmissions, etc.

SUMMARY

A transmission line structure includes a first transition element having a radio frequency injection port, a second transition element having a radio frequency termination port, and an active element electrically connected to the first transition element and the second transition element. The active element includes a first connection region where the active element is attached to the first transition element, and the first connection region is configured to reduce reflection of electromagnetic energy.

An electromagnetic compatibility test facility includes a ground surface and a transmission line structure disposed on the ground surface. The transmission line structure has a first transition element having a radio frequency injection port, a second transition element spaced from the first transition element and having a radio frequency termination port, and an active element in electrical communication with the first transition element and the second transition element. The active element includes a first connection region where the active element is attached to the first transition element. The first connection region is configured to reduce reflection of electromagnetic energy.

A transmission line structure includes a first transition element having a radio frequency injection port and a second transition element spaced from the first transition element and having a radio frequency termination port. An active element is in electrical communication with the first transition element and the second transition element. The active element includes a first connection region where the active element is attached to the first transition element, and the first connection region is configured to reduce reflection of electromagnetic energy. The first connection region is configured to increase an inductance of at least one of the first transition element and the active element and decrease a capacitance of at least one of the first transition element and the active element. The active element further includes a second connection region where the active element is attached to the second transition element. The second connection region is configured to reduce reflection of electromagnetic energy, increase an inductance of at least one of the second transition element and the active element, and decrease a capacitance of at least one of the second transition element and the active element.

DETAILED DESCRIPTION

An exemplary transmission line structure includes a first transition element having a radio frequency injection port and a second transition element having a radio frequency termination port. An active element is in electrical communication with the first transition element and the second transition element. The active element includes a first connection region where the active element is attached to the first transition element, and the first connection region reduces reflection of electromagnetic energy. For instance, the first connection region may increase an inductance of at least one of the first transition element and the active element and/or decrease a capacitance of at least one of the first transition element and the active element. Likewise, a second connection region, where the active element is attached to the second transition element, reduces reflection of electromagnetic energy by, e.g., increasing an inductance of at least one of the second transition element and the active element and/or decreasing a capacitance of at least one of the second transition element and the active element. The result of reducing reflection is a more uniform electromagnetic field generated by the transmission line structure.

Figure 1:
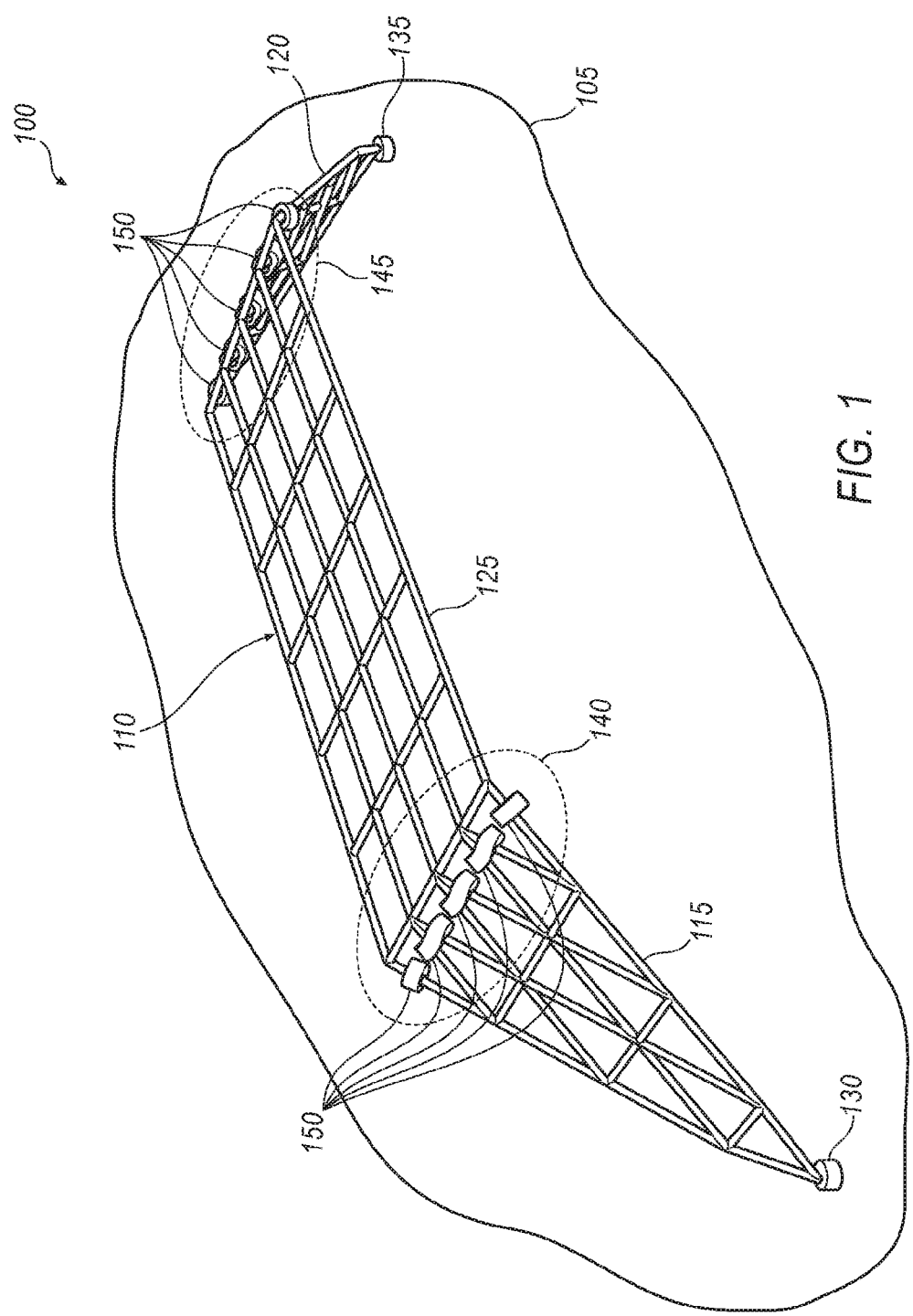
FIG. 1 illustrates an exemplary electromagnetic compatibility test facility with a transmission line structure (TLS) having a plurality of ferrite cores disposed on the stripline elements.

FIG. 1 illustrates components of an exemplary electromagnetic compatibility test environment 100. The environment may take many different forms and include multiple and/or alternate components and facilities. While an exemplary environment is shown in FIG. 1, the exemplary components illustrated in the figures are not intended to be limiting. Indeed, additional or alternative components and/or implementations may be used.

As illustrated in FIG. 1, the electromagnetic compatibility test environment 100 includes a ground surface 105 and a transmission line structure 110 disposed on the ground surface 105. At least part of the transmission line structure 110 may be spaced from the ground surface 105 so that, e.g., a device under test may be disposed between the ground surface 105 and the transmission line structure 110. The amount of space between the transmission line structure 110 and the ground surface 105, therefore, may be based at least in part on the size of the device under test. For instance, if the device under test is an automobile, the space may be approximately three (3) meters. If, on the other hand, the device under test is a mobile phone, the space may be less than one (1) meter.

The ground surface 105 may include any conductive structure that acts as a reference for voltage potential. In one possible approach, the ground surface 105 may include the surface of the Earth, a floor of a building, a ground mat, or a surface of a tabletop. In general, the ground surface 105 may be assumed to have a voltage potential of zero relative to other components in the electromagnetic compatibility test environment 100.

The transmission line structure 110 may include any device configured to generate an electromagnetic field that, in one possible implementation, may be used to test electromagnetic compatibility of a device under test. The transmission line structure 110 may be configured to generate and apply electromagnetic fields to the device under test. This simulates how electromagnetic interference may affect the device under test. The transmission line structure 110 is disposed on the ground surface 105 so all electromagnetic fields generated are relative to the potential of the ground surface 105.

The transmission line structure 110 may be generally formed from a conductive material and may include a stripline medium. In general, a stripline is a transverse electromagnetic (TEM) transmission line medium that guides electromagnetic energy consisting of electric and magnetic fields having polarization perpendicular (i.e., transverse) to a direction of propagation. The stripline used to form the transmission line structure 110 may include ports at each end, for the injection, termination, or measurement of radio frequency energy. A conductor, such as a coaxial cable may be attached to the ports. Shields of the coaxial cables may be attached to the ground surface 105, and the center of the conductors may be attached to the first transition element 115 or the second transition element 120, which are described in more detail below. In some instances, the conductor may further connect to the ports via a load cable; however, the load may alternatively be integrated into one of the ports. Various characteristics of the stripline affect the impedance of the transmission line structure 110. For instance, width and thickness are characteristics of the stripline that may affect the impedance of the transmission line structure 110.

The transmission line structure 110, as illustrated in FIG. 1, includes a first transition element 115, a second transition element 120, an active element 125.

The first transition element 115 and the second transition element 120 may each be formed from a stripline medium and may generally have any shape or configuration. The first transition element 115 and the second transition element 120 may extend between the ports 130 and 135, respectively, and the active element 125 to propagate a transverse electromagnetic wave (TEM) toward and away from the active element 125. FIG. 1 illustrates that the first transition element 115 and second transition element 120 both taper as they extend from the active element 125 to the ground surface 105. Alternatively, the first transition element 115, the second transition element 120, or both, may have different configurations. The transmission line structure 110 may include support elements (not shown) to mechanically support any one or more of the first transition element 115, the second transition element 120, or the active element 125.

The first transition element 115 may include a radio frequency injection port 130 configured to provide a radio frequency signal to the transmission line structure 110. For instance, a radio frequency generator (not shown) may be connected to the first transition element 115 via the radio frequency injection port 130. Once provided to the radio frequency injection port 130, the radio frequency signal may be propagated through the transmission line structure 110 until it reaches a radio frequency termination port 135 disposed on the second transition element 120. Either one or both of the injection port 130 or termination port 135 may be used as a measurement port under certain circumstances, such as when using the transmission line structure 110 to measure emissions.

The active element 125 may be disposed between the first transition element 115 and the second transition element 120, and like the first transition element 115 and the second transition element 120, the active element 125 may be formed from the stripline medium. As shown, the active element 125 has a generally rectangular configuration, although other configurations are possible. In one possible implementation, the active element 125 may be integrally formed with the first transition element 115 and the second transition element 120.

The active element 125 may define a first connection region 140 where the active element 125 is attached to the first transition element 115 and a second connection region 145 where the active element 125 is attached to the second transition element 120. The first transition element 115, the second transition element 120, the active element 125, or any combination of these components of the transmission line structure 110 may be configured to reduce reflection of electromagnetic energy at the first connection region 140, the second connection region 145, or both.

Reflection prohibits the transmission line structure 110 from generating a uniform electromagnetic field. Reflection may be caused by various factors, such as bends defined at the first connection region 140 and second connection region 145. Additionally, significant reflection may occur when the impedance at the first connection region 140 and/or the second connection region 145 are too low. Therefore, in one possible approach, reducing reflection may include increasing inductance at the first connection region 140 or the second connection region 145. In addition or in the alternative, reflection may be reduced by decreasing capacitance. Thus, the first connection region 140 and/or the second connection region 145 may be configured to reduce capacitance.

As illustrated in FIG. 1, the exemplary transmission line structure 110 has an increased inductance at the first connection region 140 and second connection region 145. The effect of this increased inductance includes reduced reflection, and thus, a more uniform electromagnetic field generated by the transmission line structure 110. As illustrated, the transmission line structure 110 includes a plurality of ferrite cores 150 disposed on the first transition element 115 at the first connection region 140 and the second transition element 120 at the second connection region 145. Alternatively, one or more ferrite cores 150 may be disposed on the active element 125 at the first connection region 140 or the second connection region 145.

In general, each ferrite core 150 may be a magnetic core formed from ferrite (i.e., ceramic materials with iron oxide as a principle component). The ferrite core 150 may include windings that form one or more inductors. Thus, when applied to the transmission line structure 110, and in particular at the first connection region 140 or second connection region 145, the ferrite cores 150 may increase inductance of the first transition element 115, the second transition element 120, the active element 125, or any combination of these components. Increased inductance may reduce reflection. Therefore, with one or more ferrite cores 150, the transmission line structure 110 may generate a more uniform electromagnetic field.

Figure 2:
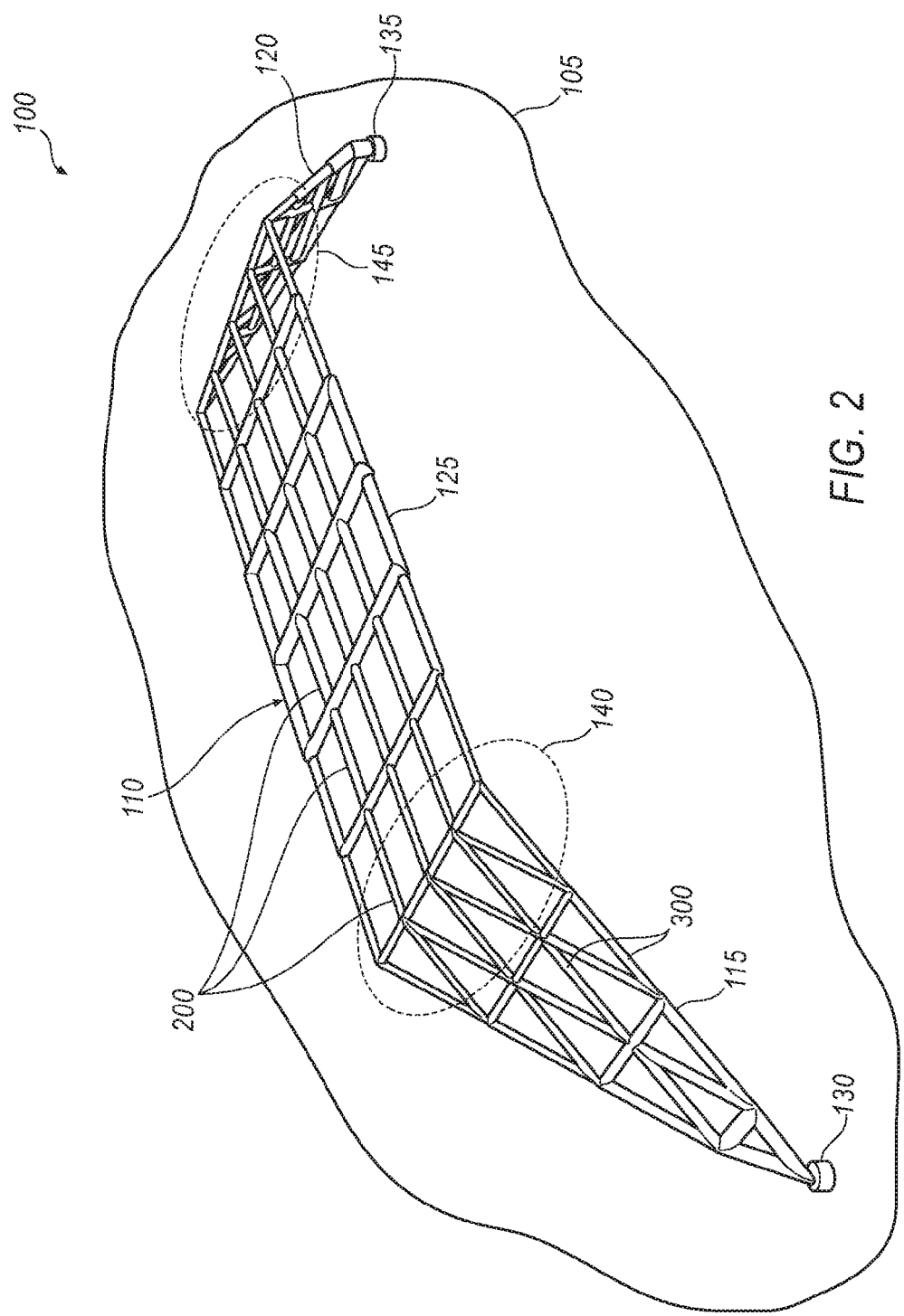
FIG. 2 illustrates an exemplary transmission line structure with stripline elements of different thicknesses.

FIG. 2 illustrates another exemplary transmission line with increased inductance and decreased capacitance near the connection regions 140 and 145. In the implementation illustrated in FIG. 2, different portions of the transmission line structure 110 have different thicknesses. For instance, the portions of the active element 125 that are furthest from the first connection region 140 and the second connection region 145 are thicker than the portions of the active element 125 that are at the first connection region 140 and the second connection region 145. Similarly, the portions of the first transition element 115 and second transition element 120 that are outside the first connection region 140 and second connection region 145, respectively, are thicker than those portions that are within the first connection region 140 and second connection region 145. In other words, the portions of the transmission line structure 110 within the first connection region 140 and the second connection region 145 are thinner than the other portions of the transmission line structure 110.

Instead of making portions of the transmission line structure 110 thinner in the first connection region 140 and the second connection region 145, an alternative approach may include reducing the number of elements within the first connection region 140 and the second connection region 145. Reducing the number of these elements may increase inductance and reduce capacitance. As discussed above, this may cause reduced reflection of electromagnetic waves, resulting in a more uniform electromagnetic field.

As shown in FIG. 2, the first transition element 115 and the second transition element 120 have a generally triangular shape while the active element 125 has a generally rectangular shape. These shapes of the first transition element 115, the second transition element 120, and the active element 125 may be formed from a plurality of stripline elements 200, which may be connected to form various shapes such as triangles and rectangles. One way to increase inductance and/or reduce capacitance in the first connection region 140 and the second connection region 145 is to reduce the number of stripline elements 200 in the first connection region 140 and the second connection region 145.

Figure 3:
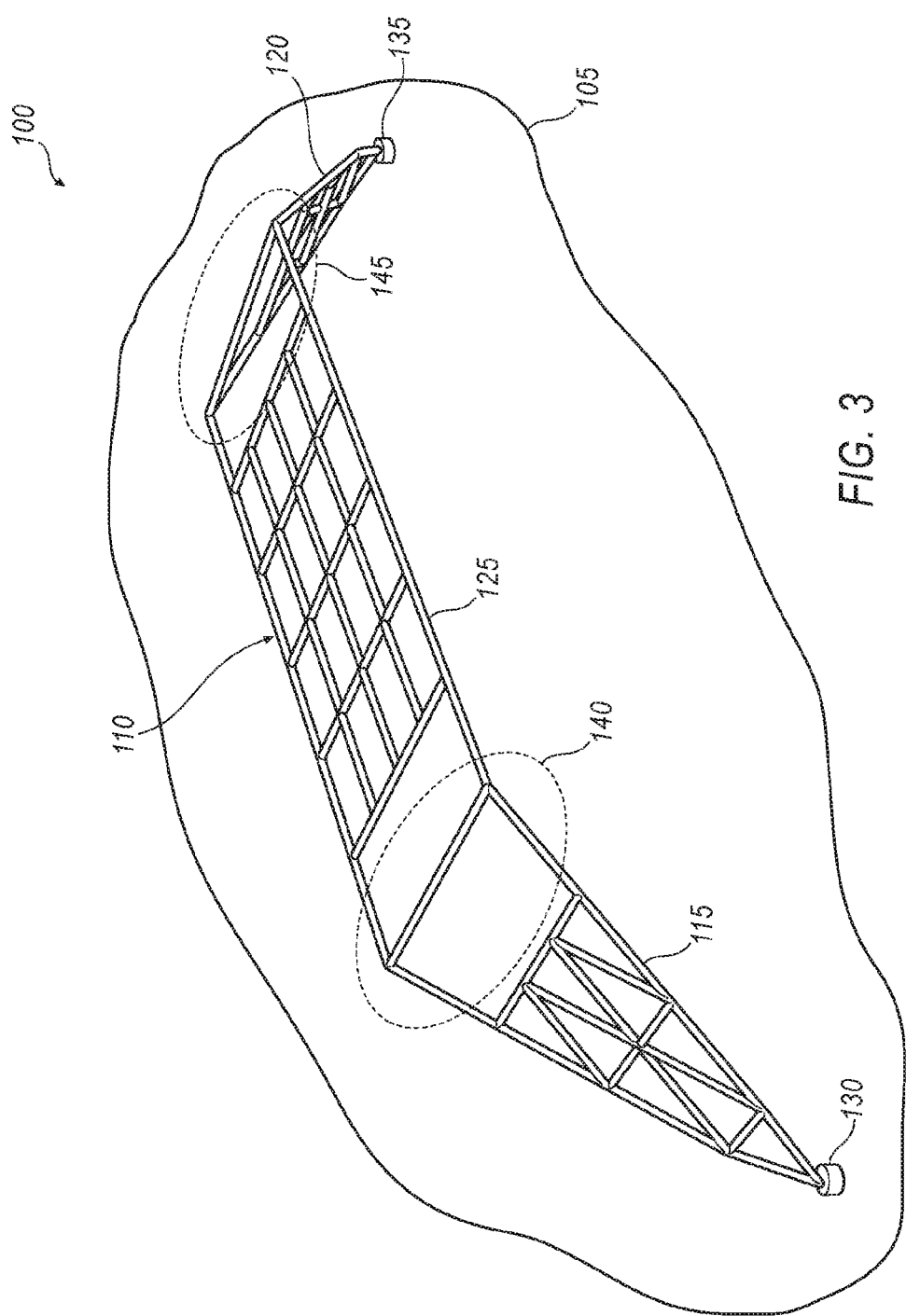
FIG. 3 illustrates an exemplary transmission line structure with different arrangements of stripline elements.

For example, referring to FIG. 3, instead of forming seven distinct triangles and four squares in the first connection region 140, the stripline elements 200 may instead form one rectangle on the active element 125 and one trapezoid on the first transition element 115. Similarly, at the second connection region 145, the stripline elements 200 may form only one rectangle on the active element 125 and one trapezoid on the second transition element 120.

Figure 4:
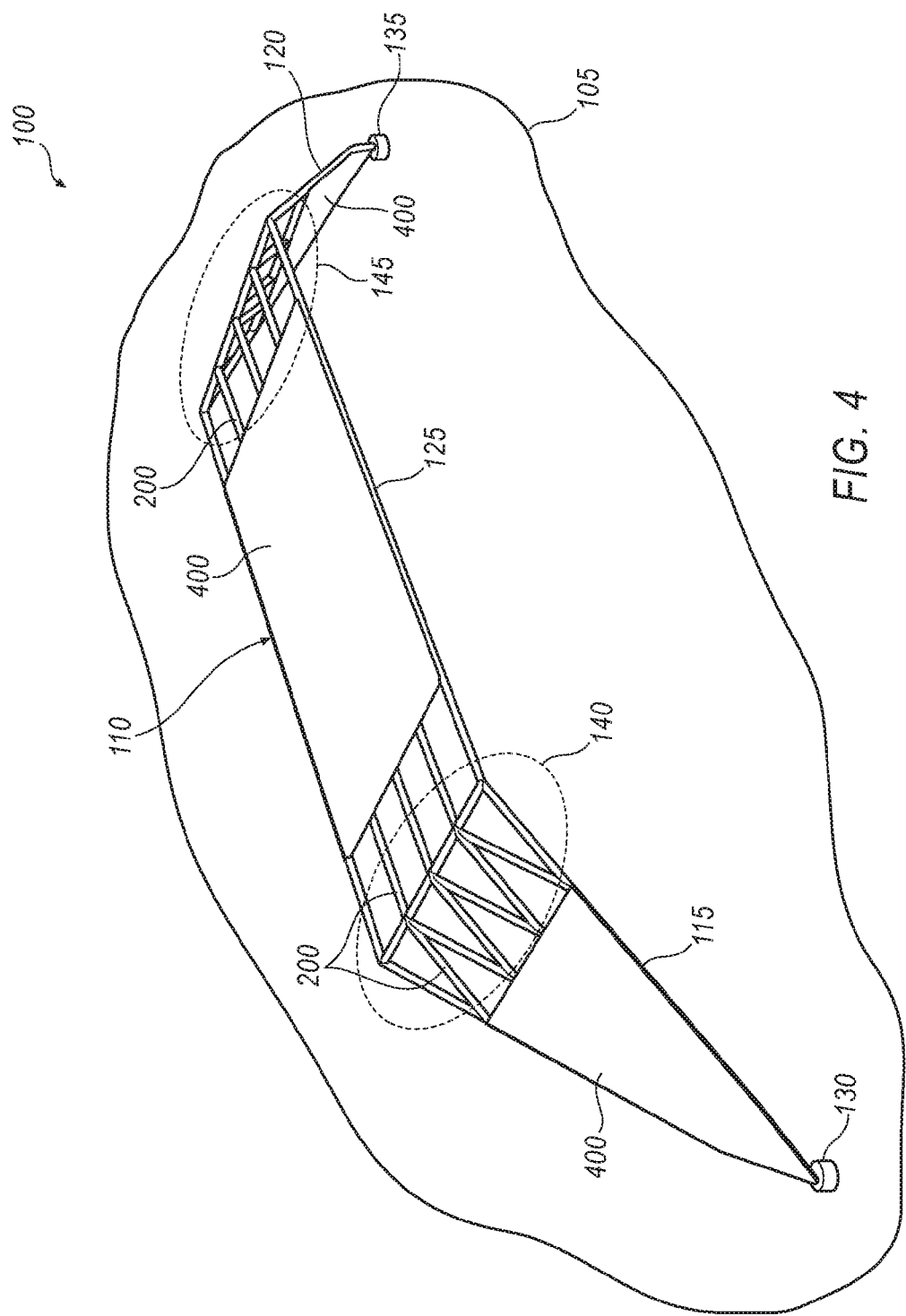
FIG. 4 illustrates an exemplary transmission line structure with stripline elements consisting of both sheet conductors and elongated (e.g., wire, tube, or rod) elements.

Another exemplary approach is illustrated in FIG. 4. As shown, the first transition element 115, the second transition element 120, and the active element 125 are partially formed from sheet conductors 400 and elongated elements, which may include wires, tubes, rods, etc. Stripline elements 200, however, are used at the first connection region 140, the second connection region 145, or both. Using stripline elements 200 in this manner relative to the sheet conductors 400 has the effect of increasing inductance and reducing capacitance at the first connection region 140 and the second connection region 145.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The invention claimed is:

1. A transmission line structure comprising:
 a first transition element having a radio frequency injection port; and
 an active element connected to the first transition element via a first connection region including a ferrite core to reduce reflection of electromagnetic energy from the first transition element off of the active element.

2. The transmission line structure of claim 1, wherein the first connection region is configured to increase an inductance of at least one of the first transition element and the active element.

3. The transmission line structure of claim 1, wherein the first connection region is configured to decrease a capacitance of at least one of the first transition element and the active element.

4. The transmission line structure of claim 1, further comprising a second transition element having a radio frequency termination port connected to the active element at a second connection region having a ferrite core to reduce reflection of electromagnetic energy due to an angle defined at the second connection region relative to the second transition element and the active element.

5. The transmission line structure of claim 4, wherein the second connection region is configured to increase an inductance of at least one of the second transition element and the active element.

6. The transmission line structure of claim 4, wherein the second connection region is configured to decrease a capacitance of at least one of the second transition element and the active element.

\* \* \* \* \*